United States Patent
Ohta (10) Patent No.: US 8,143,083 B2
(45) Date of Patent: Mar. 27, 2012

(54) PHYSICAL QUANTITY SENSOR DEVICE AND METHOD FOR PRODUCING THE SAME

(75) Inventor: Tameharu Ohta, Takahama (JP)

(73) Assignee: Denso Corporation, Kariya (JP)

( * ) Notice: Subject to any disclaimer, the term of this patent is extended or adjusted under 35 U.S.C. 154(b) by 343 days.

(21) Appl. No.: 12/588,736

(22) Filed: Oct. 27, 2009

(65) Prior Publication Data

US 2010/0043550 A1 Feb. 25, 2010

Related U.S. Application Data (62) Division of application No. 11/417,109, filed on May 4, 2006, now abandoned.

(30) Foreign Application Priority Data

May 13, 2005 (JP) ................................. 2005-141066

(51) Int. Cl.
H01L 21/00 (2006.01)
H01L 21/44 (2006.01)
(52) U.S. Cl. .................... 438/51; 438/118; 257/E21.001
(58) Field of Classification Search ........... 257/E21.001, 257/E21.002; 438/51, 118; 73/511, 514.39; 29/832
See application file for complete search history.

(56) References Cited

U.S. PATENT DOCUMENTS

| 5,959,846 | A | 9/1999 | Noguchi et al. |
| 6,199,429 | B1 | 3/2001 | Hirosawa |
| 6,593,663 | B2 | 7/2003 | Ikezawa et al. |
| 7,432,586 | B2 | 10/2008 | Zhao et al. |
| 2004/0046248 | A1* | 3/2004 | Waelti et al. .................. 257/712 |
| 2005/0257615 | A1 | 11/2005 | Ohta |
| 2005/0280139 | A1 | 12/2005 | Zhao et al. |

FOREIGN PATENT DOCUMENTS

| JP | A-11-264731 | 9/1999 |
| JP | A-2002-195834 | 7/2002 |
| JP | A-2002-250627 | 9/2002 |
| JP | A-2003-250627 | 9/2002 |
| JP | A-2003-021515 | 1/2003 |
| JP | A-2003-028647 | 1/2003 |

* cited by examiner

Primary Examiner — Wael Fahmy
Assistant Examiner — Sarah Salerno
(74) Attorney, Agent, or Firm — Posz Law Group, PLC

(57) ABSTRACT

A circuit board is mounted on a package via an adhesive agent as an elastic member. A sensor element is stacked in fixed relation onto the circuit board. The sensor element, the circuit board, and the package are wired with bonding wires. A magnetic member made of a ferromagnetic material is disposed between the adhesive agent and the circuit board.

20 Claims, 6 Drawing Sheets

PHYSICAL QUANTITY SENSOR DEVICE AND METHOD FOR PRODUCING THE SAME

CROSS REFERENCE TO RELATED APPLICATIONS

This application is a divisional of U.S. patent application Ser. No. 11/417,109 filed on May 4, 2006 and entitled PHYSICAL QUANTITY SENSOR DEVICE, and is based on Japanese Patent Application No. 2005-141066 filed on May 13, 2005, the disclosure of which is incorporated herein by reference.

FIELD OF THE INVENTION

The present invention relates to a physical quantity sensor device including a sensor element for sensing a physical quantity; the sensor element is mounted on a package and held thereby via an elastic member having elasticity.

BACKGROUND OF THE INVENTION

A physical quantity sensor device of this type typically includes a sensor element for sensing a physical quantity such as an angular velocity or acceleration; the sensor element is mounted on a package. This type of physical quantity sensor device has an application as an angular velocity sensor device or acceleration sensor device.

In such a physical quantity sensor device, a problem occurs in sensor characteristics when an impact from the outside, i.e., an external acceleration is applied thereto.

For example, an angular velocity sensor device senses an angular velocity based on a Coriolis force generated in a sensing direction. However, an acceleration in the sensing direction may be transmitted to a sensor element from the outside via a package even when an angular velocity is not actually applied thereto. Here, an output is produced as though an angular velocity occurred.

With respect to such a physical quantity sensor device, a structure has been conventionally proposed in which a sensor element is held on a package via an elastic member having elasticity such as an adhesive agent or rubber.

Here, the elastic member functions as an anti-vibration member to absorb unnecessary vibration resulting from an external acceleration (see, e.g., PATENT DOCUMENTs 1 to 7).

In such a structure, the external acceleration is attenuated by the elastic function of the elastic member in a path in which the external acceleration is transmitted to the sensor element via the package. The attenuated external acceleration is thus transmitted to the sensor element. Accordingly, this structure may reduce the unnecessary vibration to the sensor element.

In this structure of the physical quantity sensor device, however, it may be difficult to properly perform bonding relative to a component (e.g., sensor element) mounted on the elastic member, or to properly mount the component on the elastic member. This may cause a problem that sufficient assembly cannot be obtained.

Figure 8:
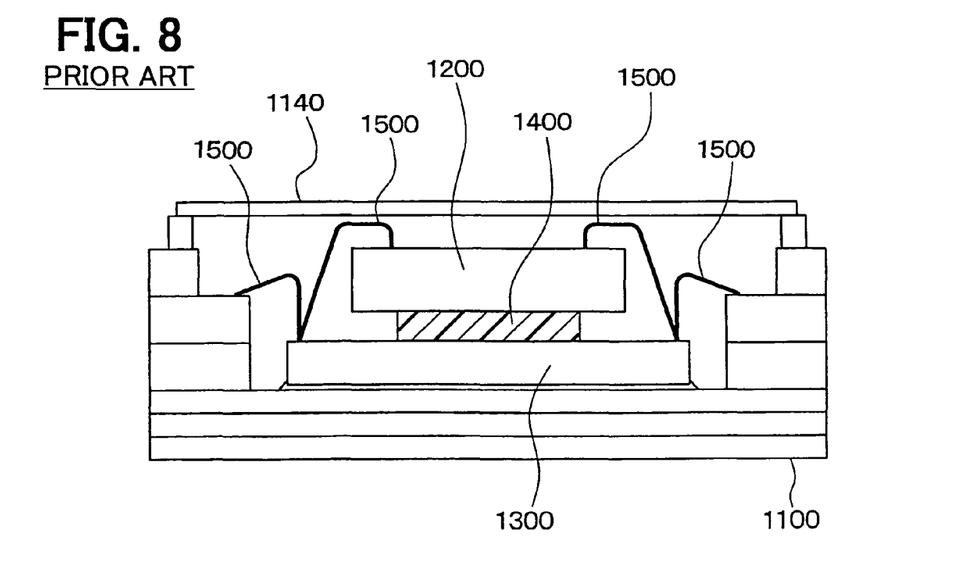
FIG. 8 is a schematic cross-sectional view of a physical quantity sensor device when a low-elasticity adhesive film is used as an elastic member, in a prior art.

FIG. 8 is a view showing a schematic cross-sectional structure of a conventional physical quantity sensor device when, e.g., a low-elasticity adhesive film is used as an elastic member.

In FIG. 8, a circuit board 1300 is mounted on a package 1100 and fixed thereto. A sensor element 1200 is stacked on the circuit board 1300 via an adhesive film 1400 as the elastic member. The sensor element 1200 and the circuit board 1300 are wired with bonding wires 1500 to be electrically connected.

In the conventional physical quantity sensor device, to form a soft adhesion structure for serving as an anti-vibration structure, the low-elasticity adhesive film 1400 is used as the adhesion portion thereof. In the structure, the low-elasticity adhesive film 1400 is used to fix the sensor element 1200 located thereon for an anti-vibration purpose. As a result, the upper portion of the adhesive film 1400 is low in rigidity.

Wire bonding may be performed relative to the mounted component, i.e., sensor element 1200 on the adhesive film 1400, or another component may be mounted in addition to the sensor element 1200. In this case, the holding of the sensor element 1200 becomes unstable so that assembly such as bonding or mounting becomes difficult.

In contrast, to design the structure to be stable during the assembly, the adhesive film 1400 as the elastic member should be hardened. This causes a problem that the elastic function of the adhesive film 1400 is not performed, the amount of attenuation is reduced, and the external acceleration is more likely to be transmitted to the sensor element 1200.

PATENT DOCUMENT 1
JP-H11-218424A
PATENT DOCUMENT 2
JP-H11-264731 A
PATENT DOCUMENT 3
JP-2002-195834 A
PATENT DOCUMENT 4
JP-2002-250627 A
PATENT DOCUMENT 5
JP-2003-21515 A
PATENT DOCUMENT 6
JP-2003-28647 A
PATENT DOCUMENT 7
JP-2003-21647 A

SUMMARY OF THE INVENTION

An object of the present invention is to provide a physical quantity sensor device capable of addressing the foregoing problem. This physical quantity sensor device includes a sensor element for sensing a physical quantity: the sensor element is mounted on a package and held thereby via an elastic member having elasticity. This physical quantity sensor device is to properly balance the trade-off between the elastic function and efficient assembly.

As an aspect of the present invention, a physical quantity sensor device is provided as follows. A sensor element is included for sensing a physical quantity. A package to which the sensor element is mounted is included. An elastic member having elasticity is included to be disposed between the sensor element and the package for holing the sensor element to the package. The elastic member faces (i) a first space including the sensor element and (ii) a second space opposing to the first space. A magnetic member made of a ferromagnetic material is included in the first space.

DETAILED DESCRIPTION OF THE PREFERRED EMBODIMENTS

Example Embodiment 1

Figure 1:
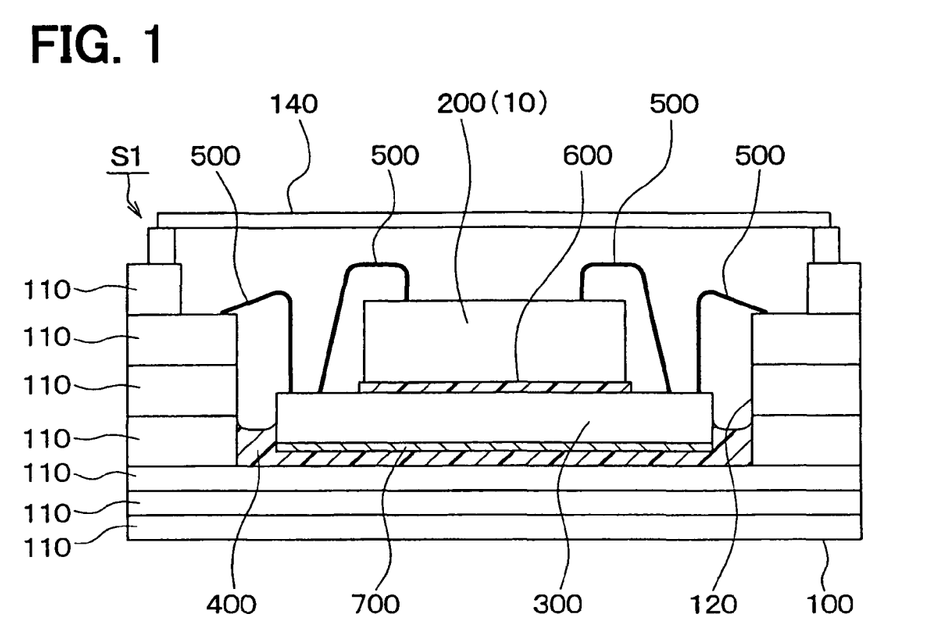
FIG. 1 is a schematic cross-sectional view of an angular velocity sensor device as a physical quantity sensor device according to a first example embodiment of the present invention.

FIG. 1 is a view showing a schematic cross-sectional structure of an angular velocity sensor device S1 as a physical quantity sensor device according to a first example embodiment of the present invention.

Structure, Etc.

As shown in FIG. 1, the angular velocity sensor device S1 broadly includes the following: a package 100; a circuit board 300 held on the package 100 via an adhesive agent 400 as an elastic member; a sensor element 200 stacked on the circuit board 300 and adhered thereto via an adhesive film 600, for sensing an angular velocity; and bonding wires 500 for coupling the foregoing components to each other.

The package 100 contains the sensor element 200 and the circuit board 300, serves as a base portion for defining a main body of the angular velocity sensor device S1, and allows the angular velocity sensor device S1 to contact a proper position of a subject to measure.

In an example shown in FIG. 1, the package 100 is a multilayer substrate including multiple stacked ceramic layers 110 made of, e.g., alumina or the like. Wires (not shown) are formed on a surface of each of the layers 110 and in through holes formed in the individual layers 110. The angular velocity sensor device S1 can be electrically coupled to an outside via the wires.

The package 100 also has a depressed portion 120 in the bottom portion thereof, to contain the circuit board 300. The circuit board 300 contained in the depressed portion 120 is mounted on the bottom portion of the package 100 and fixed thereto via the adhesive agent 400 as the elastic member.

The adhesive agent 400 is an elastic member having elasticity and made of, e.g., a resin such as a silicone gel. The adhesive agent 400 functions herein as an anti-vibration member to attenuate an external acceleration applied from the package 100 to the sensor element 200 as an angular velocity sensing element.

A lid 140 made of a metal, resin, ceramic, or the like is attached to an opening of the package 100. The lid 140 seals an inside of the package 100. The lid 140 is made of a metal herein and bonded to the package 100 by welding such as seam welding or brazing.

The sensor element 200 is stacked on an upper surface of the circuit board 300 via the adhesive member 600. The adhesive member 600 is harder than the adhesive agent 400 as the elastic member and has rigidity. As the adhesive member 600, an adhesive film made of, e.g., a silicone-based resin or the like can be adopted.

The sensor element 200 is an angular velocity sensing element for sensing an angular velocity. The sensor element 200 can be formed as a semiconductor chip that forms a beam structure having a commonly known comb-tooth structure relative to a silicon substrate or the like. The sensor element 200 senses a change in electrostatic capacitance (electric signal) between a movable electrode and a fixed electrode; the electrostatic capacitance is responsive to an applied angular velocity.

Figure 2:
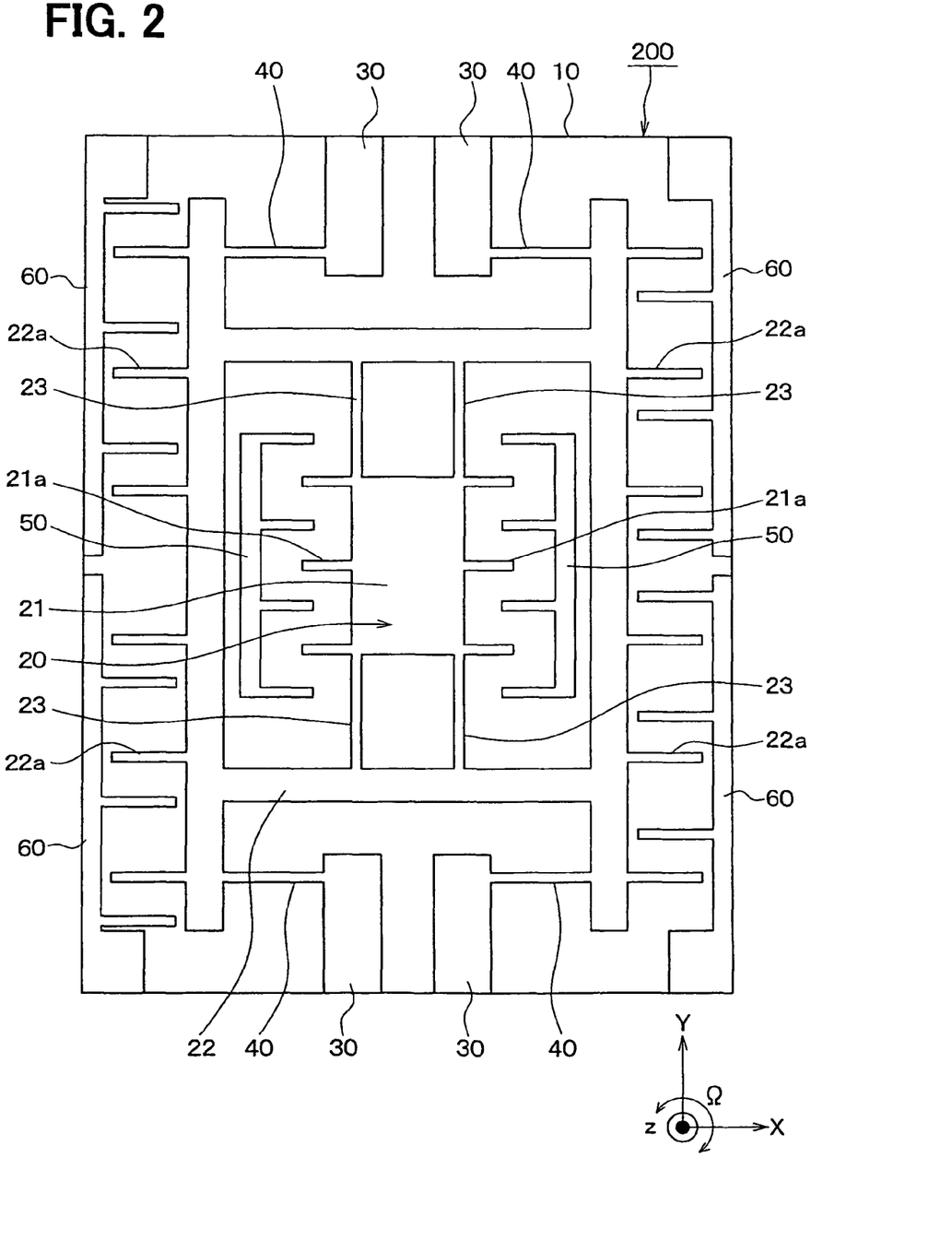
FIG. 2 is a schematic plan view of a sensor element in the angular velocity sensor device shown in FIG. 1.

Referring primarily to FIG. 2, a description will be given to a detailed structure of the sensor element 200. FIG. 2 is a view showing a schematic plan structure of the sensor element 200 in the angular velocity sensor device S1 shown in FIG. 1.

The sensor element 200 has a substrate 10 such as a semiconductor substrate and is formed by performing a well-known micromachining process with respect to the substrate 10. The substrate 10 can adopt, e.g., a rectangular SOI (silicon-on-insulator) substrate. The SOI substrate is formed by laminating a second silicon layer (second semiconductor layer) on a first silicon layer (first semiconductor layer) via an oxide film (insulating layer).

Beam structures 20 to 60 are defined by trenches, as shown in FIG. 2. The beam structures 20 to 60 are formed by performing trench etching, release etching, and the like with respect to a surface layer of the substrate 10, e.g., the second silicon layer of the SOI substrate. The beam structures 20 to 60 include a vibrator 20, beam portions 23 and 40, and electrodes 50 and 60, which will be described later.

The vibrator 20 is formed at a center portion of the substrate 10 and capable of vibrating within a plane horizontal to the substrate 10, i.e., in the plane in FIG. 2. In this example embodiment, the vibrator 20 includes a first vibrating portion 21 having a generally rectangular configuration positioned at the center portion; a second vibrating portion 22 configured as a rectangular frame positioned around the outer periphery of the first vibrating portion 21; and a driving beam portion 23 coupling the first and second vibrating portions 21 and 22 to each other.

The vibrator 20 is coupled to an anchor portion 30 provided on a peripheral portion of the substrate 10 via the sensing beam portion 40. The anchor portion 30 is fixed to and supported by the portion of the substrate 10 which is located below the surface layer formed with the beam structure 20, i.e., the supporting substrate portion of the substrate 10. The vibrator 20 is floating from the supporting substrate portion.

As shown in FIG. 2, the driving beam portion 23 is configured to extend in, e.g., a y-direction such that it is elastically deformable substantially only in an x-direction. On the other hand, the sensing beam portion 40 is configured to extend in, e.g., the x-direction such that it is elastically deformable substantially only in the y-direction.

Of the vibrator 20, the first vibrating portion 21 is allowed to vibrate in the x-direction (driving vibration direction) in a plane horizontal to the substrate 10 by the driving beam portion 23. On the other hand, the whole vibrator 20 is allowed to vibrate in the y-direction (sensing vibration direction) in a plane horizontal to the substrate 10 by the sensing beam portion 40.

Between the first and second vibrating portions 21 and 22, driving electrodes 50 are provided for causing the driving vibration of the first vibrating portion 21 in the x-direction.

The driving electrodes 50 are fixed to the supporting substrate portion mentioned above, similarly to the anchor portion 30. The driving electrodes 50 are disposed to oppose a comb-tooth portion (comb-tooth portion for driving) 21a projecting from the first vibrating portion 21 such that the comb teeth thereof and those of the comb-tooth portion 21a interdigitate.

On the other hand, sensing electrodes 60 are provided in an outer periphery of the second vibrating portion 22. The sensing electrodes 60 sense an angular velocity around a z-axis perpendicular to the substrate 10 based on the vibration of the vibrator 20 and are fixed to the supporting substrate portion, similarly to the anchor portion 30. The sensing electrodes 60 are disposed to oppose a comb-tooth portion (comb-tooth portion for sensing) 22a projecting from the second vibrating portion 22 such that the comb teeth thereof and those of the comb-tooth portion 22a interdigitate.

Additionally, in the present sensor element 200, pads made of aluminum or the like are provided at appropriate positions on the substrate 10 to apply voltages to the vibrator 20, driving electrodes 50, sensing electrodes 60, and the like mentioned above or to retrieve signals therefrom.

These pads are provided on, e.g., the peripheral portion of the substrate 10. To these pads, the above-mentioned bonding wires 500 made of Au (gold), aluminum, or the like are connected, as shown in FIG. 1. The sensor element 200 according to this example embodiment has a structure as described above.

The circuit board 300 used herein is an IC chip or the like in which, e.g., a MOS transistor, a bipolar transistor, or the like has been formed by using a well-known semiconductor process on a silicon substrate or the like. The circuit board 300 can be also a signal processing chip having functions of sending a voltage to the sensor element 200, processing an electric signal from the sensor element 200, outputting the processed electric signal to the outside, and the like.

As shown in FIG. 1, the sensor element 200 and the circuit board 300 are electrically coupled via the above-mentioned bonding wires 500 made of gold, aluminum, or the like, while the circuit board 300 and the package 100 are also electrically coupled via the bonding wires 500.

Thus, the individual components of the sensor element 200, the circuit board 300, and the package 100 are electrically connected via the bonding wires 500. It is to be noted that the sensor element 200 and the circuit board 300 need not be connected directly via the bonding wires 500, as shown in FIG. 1.

For example, the sensor element 200 can be coupled to the package 100 via the bonding wires 500, while the package 100 is coupled to the circuit board 300 via the bonding wires 500. In this case, the sensor element 200 and the circuit board 300 can be similarly coupled to each other via the bonding wires 500, though with intervention of the package 100.

In this manner, an electric signal (capacitance change) from the sensor element 200 is sent to the circuit board 300, converted to a voltage signal by a C/V conversion circuit or the like provided on the circuit board 300, and outputted as an angular velocity signal.

Thus, the angular velocity sensor device S1 according to this example embodiment is constructed by successively stacking the circuit board 300 and the sensor element 200 on the package 100 via the adhesive agent 400 as the elastic member.

Further, as a structure peculiar to this example embodiment, a magnetic member 700 made of a ferromagnetic material is provided at a given portion. Here, to define the given portion, explanation will be added. As explained above, the adhesive agent 400 is disposed between the sensor element 200 and the bottom portion of the package 100. The adhesive agent 400 has (i) a first side facing a first space in which the sensor element 200 is included and (ii) a second side facing a second space that opposes the first space (in the example in FIG. 1, the second space includes the bottom portion of the package 100). In other words, the elastic member faces (i) the first space (also called sensor-element-side space) including the sensor element and (ii) the second space (also called package-side space) not including the sensor element 200 (in the example in FIG. 1, the second space includes the bottom portion of the package 100). The given portion is defined to be included in this first space or the sensor-element-side space with respect to the adhesive agent 400. The magnetic member 700 is thus disposed at the given portion included in the sensor-element-side space which the adhesive agent 400 faces via the first side. For instance, in this example embodiment, the magnetic member 700 is disposed or interposed between the adhesive agent 400 and the sensor element 200.

For instance, in this example embodiment, the circuit board 300 is mounted on the package 100 via the adhesive agent 400 as the elastic member and the sensor element 200 is stacked in fixed relation onto the circuit board 300, while the magnetic member 700 is interposed between the adhesive agent 400 and the circuit board 300.

The magnetic member 700 is configured as a plate in this example embodiment and bonded to the circuit board 300 via a hard adhesive agent not shown, e.g., an adhesive agent made of a silicone-based resin or the like. The magnetic member 700A includes magnetic material with ferromagnetism such as iron, nickel, cobalt, or an alloy thereof.

For instance, 42 alloy, Kovar™, or the like having a linear expansion coefficient close to that of the Si chip composing the circuit board 300 can be used for the magnetic member 700. However, any material having ferromagnetism at the working temperature thereof may be appropriately used, provided that it meets the object of allowing fixation using a magnetic force and there is no requirement concerning other characteristics.

In the angular velocity sensor device S1 according to this example embodiment, it is also possible to preliminarily magnetize a material such as ferrite, which is a ferromagnetic material, and use the resulting magnet as the magnetic member 700.

Fabrication Method, Operation, Etc.

A method for fabricating the angular velocity sensor device S1 thus constructed according to this example embodiment will be described with reference to FIGS. 3A to 3F and FIGS. 4A to 4C. These figures are process step diagrams for illustrating the fabrication method according to this example embodiment and are schematic cross-sectional views obtained by viewing work in the individual fabrication process steps from the same viewpoint as in FIG. 1.

Figure 3A:
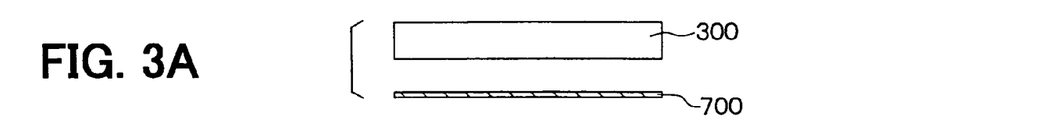
FIGS. 3A to 3F are process step diagrams each illustrating a method for fabricating the angular velocity sensor device shown in FIG. 1.

First, as shown in FIG. 3A, the magnetic member 700 is adhered to the surface of the circuit board 300 to be mounted on the package 100.

In this example embodiment, a method has been adopted which preliminarily processes the magnetic member 700 into the size of the circuit board 300, i.e., into the chip size and then bonds the magnetic member 700 to the circuit board 300. However, it is also possible to bond the wafer-size magnetic member 700 to a wafer of the circuit boards 300 at a stage before it is cut into individual chips and then form the circuit boards 300 as the chips with the magnetic members 700 through simultaneous dicing.

Figure 3B:
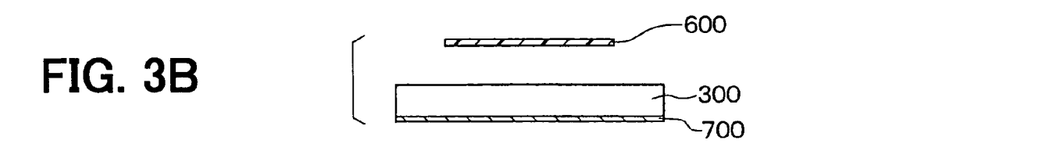
Figure 3C:
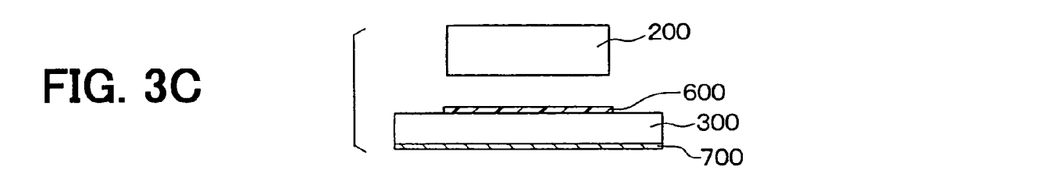
Figure 3D:
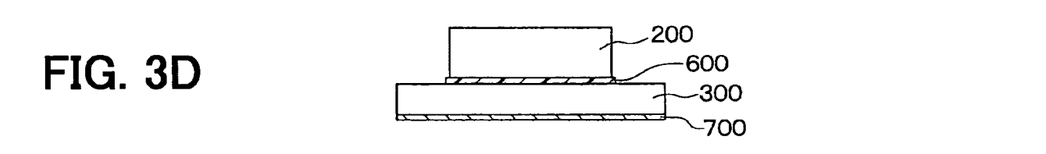

Next, as shown in FIG. 3B, the adhesive member 600 for fixing the sensor element 200 is placed on the circuit board 300. Then, as shown in FIG. 3C, the sensor element 200 is aligned on the circuit board 300. Then, as shown in FIG. 3D, the sensor element 200 is mounted on the circuit board 300 via the adhesive member 600 and adhesively fixed thereto.

The sensor element 200 may be also formed as a chip with the adhesive member 600 by bonding the adhesive member 600 composed of an adhesive film to a wafer of the sensor elements 200 at a stage before it is cut into individual chips and then perform simultaneous dicing. The resulting sensor element 200 may be also stacked on the circuit board 300 and adhered thereto.

These process steps result in completing a sensor module in which the sensor element 200 is stacked in fixed relation onto the circuit board 300 with the magnetic member 700. Subsequently, the sensor module is mounted on the package 100.

Figure 3E:
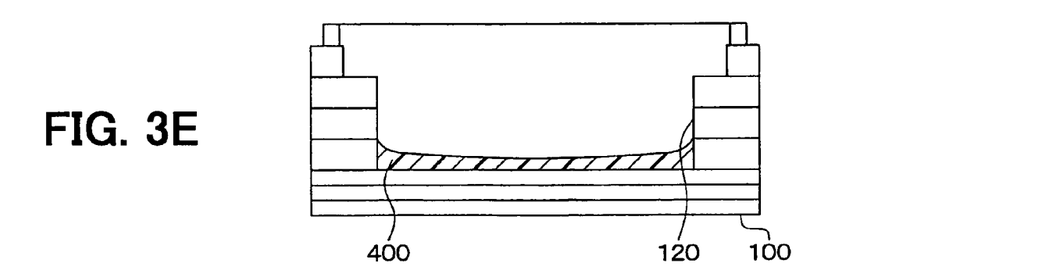
Figure 3F:
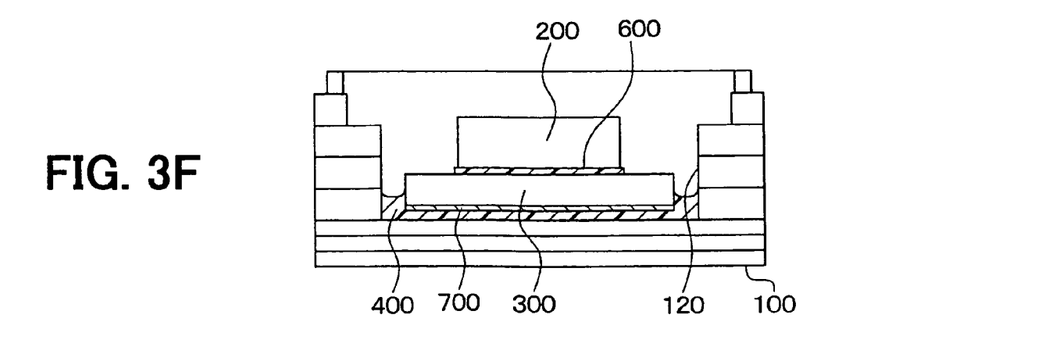

First, as shown in FIG. 3E, the adhesive agent 400 as the elastic member described above is applied onto the bottom portion of the depressed portion 120 of the package 100. Then, as shown in FIG. 3F, the sensor module is mounted on the adhesive agent 400 with the magnetic member 700 opposing the bottom portion of the package 100.

Then, by curing the adhesive agent 400, the magnetic member 700 of the sensor module is bonded to the package 100. In a currently reached state, the sensor module, i.e., the circuit board 300 and the sensor element 200 are held by the soft adhesive agent 400 as the elastic member and wire bonding is difficult to perform in this state.

Figure 4A:
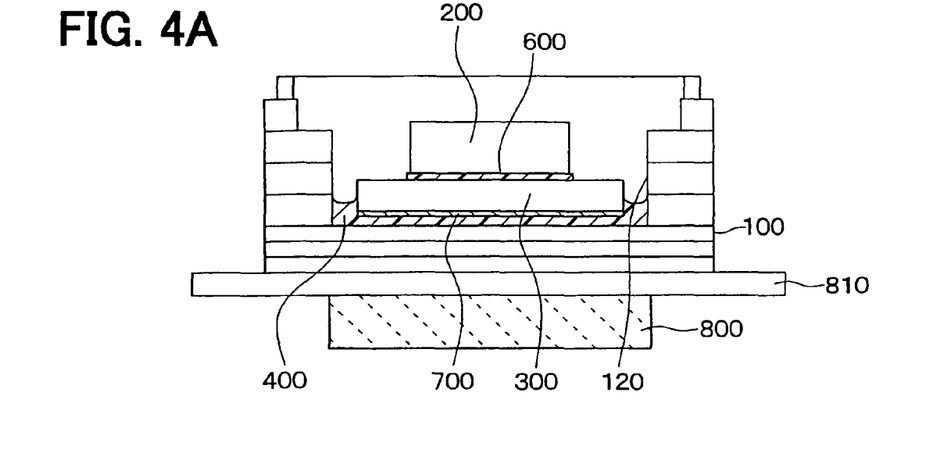
FIGS. 4A to 4C are process step diagrams each illustrating the fabrication method, which are subsequent to FIGS. 3A to 3F.

When wire bonding is performed, a magnet 800 is provided herein below the package 100, as shown in FIG. 4A. The magnet 800 can be incorporated into a bonding apparatus or a fixing jig 810 for the package 100 to act as a magnet chuck.

By the magnet 800, a magnetic force is generated to press the magnetic member 700 against the package 100 via the adhesive agent 400. As a result, the movement of the magnetic member 700 is suppressed and the movement of the sensor module during bonding can be suppressed. In short, the magnet 800 is constructed as a magnetic member fixing means for solidly fixing the magnetic member 700 by using a magnetic force.

Figure 4B:
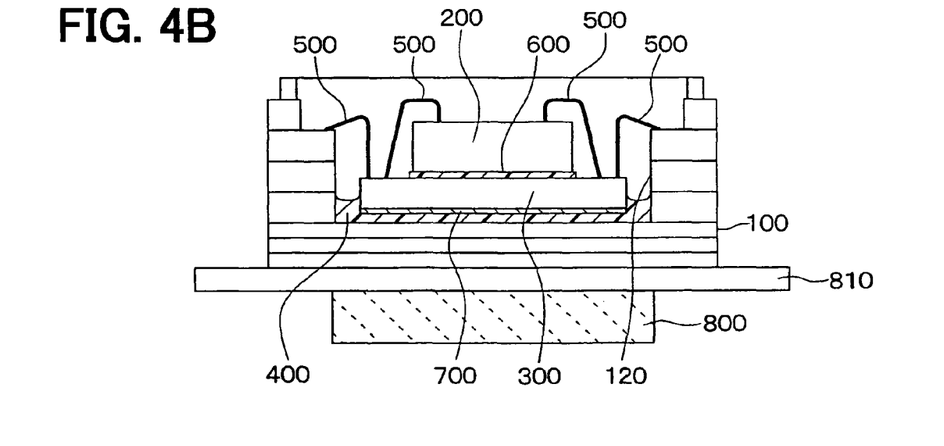

As shown in FIGS. 4A to 4B, wire bonding is performed in the state in which the sensor module described above is solidly fixed to the package 100 by thus using the magnetic force of each of the magnet 800 below the package 100 and the magnetic member 700. As a result, the package 100 and the circuit board 300 are wired with the bonding wires 500, while the sensor element 200 and the circuit board 300 are wired with the bonding wires 500.

Figure 4C:
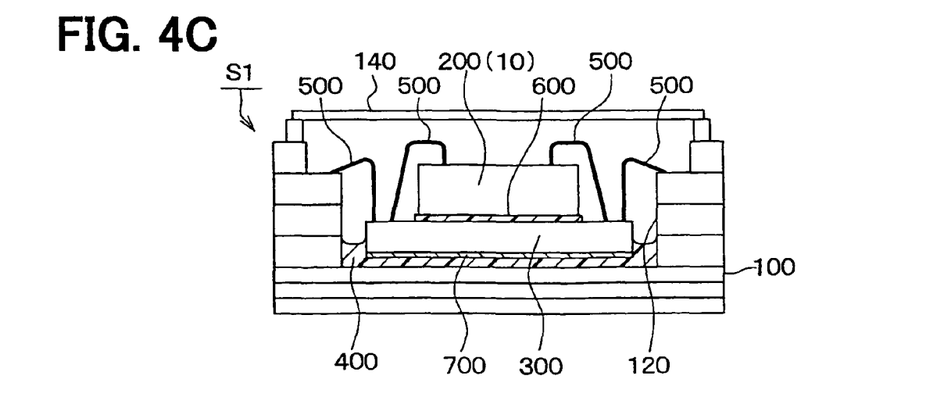

After wire bonding is completed, the package 100 is detached from above the magnet 800 as shown in FIG. 4C so that the magnetic force is removed. Then, by welding or brazing the lid 140 to the package 100, the inside of the package 100 is sealed, thereby completing the angular velocity sensor device S1 described above.

It is also possible to use a magnet such as ferrite to compose the magnetic member 700 and use a ferromagnetic material such as iron to compose the magnetic member fixing means below the package 100 in place of the magnet 800. The arrangement also allows the same effect to be obtained. To obtain a fixing strength, each of the magnetic member 700 and the magnetic member fixing means can also be composed of a magnet.

The foregoing example shown in FIGS. 3A to 3F and FIGS. 4A to 4C mounts the sensor module described above on the package 100 via the adhesive agent 400, cures the adhesive agent 400, and then performs wire bonding. The curing of the adhesive agent 400 may be also performed after wire bonding.

In this case, wire bonding is performed with the sensor module temporarily bonded using the uncured adhesive agent 400 having fluidity. However, during wire bonding, a solidly fixed structure can be implemented by using the magnetic force of the magnetic member 700 irrespective of the adhesive agent and a sufficient bonding property can be obtained.

In this case, the adhesive agent 400 is cured after wire bonding. At this time, when the magnetic member 700 and the magnetic member fixing means are composed of magnets each having the same polarity, a repelling force acts between the magnetic member 700 and the package 100. This allows the suppression of the thinning of the adhesive agent 400 under the weight of the sensor module and allows the adhesive 400 to retain a sufficient thickness.

In the foregoing example shown in FIGS. 3A to 3F and FIGS. 4A to 4C, the magnetic member 700, the circuit board 300, and the sensor element 200 have been incorporated to produce the sensor module; then, the sensor module is mounted on the package 100 via the adhesive agent 400. This order in which the individual components are mounted on the package 100 is not limited thereto.

For example, it is also possible to mount the magnetic member 700 on the package 100 via the adhesive agent 400, adhesively mount the circuit board 300 and the sensor element 200 in succession thereon in the state in which the magnetic member 700 is solidly held by using a magnetic force, and then further perform wire bonding.

Alternatively, it is also possible to mount the circuit board 300 with the magnetic member 700 on the package 100 via the adhesive agent 400, adhesively mount the sensor element 200 thereon in the state in which the magnetic member 700 and the circuit board 300 are solidly held by using a magnetic force, and then further perform wire bonding.

It is to be noted that the completed angular velocity sensor device S1 is in a normal use state with no magnetic force applied thereto so that the movement of the sensor element 200 is not suppressed. Accordingly, the anti-vibration performance of the adhesive agent 400 is sufficiently exerted as designed.

Referring primarily to FIG. 2, the sensing operation in such an angular velocity sensor device S1 will be described.

A driving signal (sinusoidal voltage or the like) is applied from the circuit board 300 to the driving electrodes 50 of the sensor element 200 via the bonding wires 500 to generate an electrostatic force between the comb-tooth portion 21a of the first vibrating portion 21 mentioned above and the driving electrodes 50. As a result, the elastic force of the driving beam portion 23 causes the driving vibration of the first vibrating portion 21 in the x-direction.

When an angular velocity $\Omega$ is applied around the z-axis as a result of the driving vibration of the first vibrating portion 21, a Coriolis force is applied in the y-direction to the first vibrating portion 21 so that the elastic force of the sensing beam portion 40 causes the sensing vibration of the whole vibrator 20 in the y-direction.

As a result, the sensing vibration causes a change in the capacitance between the respective comb teeth of the sensing electrodes 60 and the comb-tooth portion 22a for sensing. By sensing the capacitance change, the magnitude of the angular velocity $\Omega$ can be determined.

For instance, when the vibrator 20 is displaced unilaterally in the y-direction, capacitance changes in opposite directions occur in the left and right sensing electrodes 60 in FIG. 2. The capacitance changes in the left and right sensing electrodes 60 are individually converted to voltages and the two voltage values are differentially amplified and outputted so that the angular velocity $\Omega$ is determined.

Effect, Etc.

In the angular velocity sensor device S1 as a physical quantity sensor device, the sensor element 200 for sensing an angular velocity as a physical quantity is mounted on the package 100 and held thereby via the adhesive agent 400 as an elastic member having elasticity. The angular velocity sensor device S1 is characterized in that the magnetic member 700 made of a ferromagnetic material is provided in the sensor-element-side space with respect to the adhesive agent 400, as shown in FIG. 1.

The arrangement allows a magnetic force to act from outside the package 100 such that the magnetic member 700 is pressed against the package 100, as described above. By the magnetic force, the sensor element 200 on the elastic member 400 is more solidly fixed to the package 100 than when it is merely held by the adhesive agent 400 as the elastic member 400.

Thus, the foregoing magnetic force is caused to act during the assembly or the like and to solidly hold components including the sensor element 200 mounted on the package 100 via the adhesive agent 400. It becomes possible to properly mount them on the adhesive agent 400 and/or perform bonding relative to the components mounted on the adhesive agent 400. This allows efficient assembly.

For instance, the arrangement is effective when wire bonding is performed relative to the components (including the sensor element 200) mounted on the adhesive agent 400 as the elastic member. This is because the magnetic force stabilizes the supporting of the members to be bonded.

Subject components mounted on the adhesive agent 400 as the elastic member are not limited to the sensor element 200 and the circuit board 300. For example, a component (not shown) mounted as necessary on the sensor element 200 can be also included in one of the subject components. When such a component is mounted on the adhesive agent 400, fixation using the magnetic force as described above is effective.

When the angular velocity sensor device S1 is used, the adhesive agent 400 is allowed to exert the elastic function as exerted conventionally by removing the magnetic force in the angular velocity sensor device S1. This allows the anti-vibration function or the like to be performed and unnecessary vibration resulting from an external acceleration to be absorbed.

Thus, this example embodiment allows the angular velocity sensor device S1 to properly balance the trade-off between the elastic function and the efficiency in assembly.

The angular velocity sensor device S1 according to this example embodiment is characterized in that the magnetic member 700 is interposed between the adhesive agent 400 and the sensor element 200. The arrangement can properly provide the magnetic member 700 in the sensor-element-side space with respect to the adhesive agent 400.

The angular velocity sensor device S1 according to this example embodiment is also characterized in that the circuit board 300 is mounted on the package 100 via the adhesive agent 400 as the elastic member and the sensor element 200 is stacked in fixed relation onto the circuit board 300, while the magnetic member 700 is interposed between the adhesive agent 400 and the circuit board 300.

Example Embodiment 2

Figure 5:
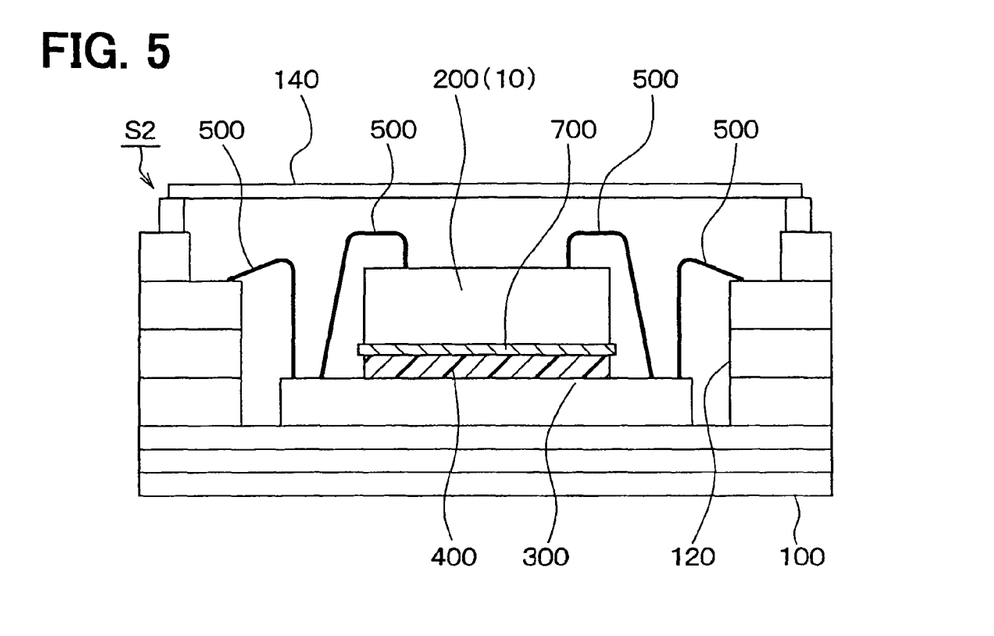
FIG. 5 is a schematic cross-sectional view of an angular velocity sensor device as a physical quantity sensor device according to a second example embodiment of the present invention.

FIG. 5 is a view showing a schematic cross-sectional structure of an angular velocity sensor device S2 as a physical quantity sensor device according to a second example embodiment of the present invention.

The angular velocity sensor device S2 according to this example embodiment is also the angular velocity sensor device, in which the sensor element 200 is mounted on the package 100 and held thereby via the adhesive agent 400 as the elastic member. In addition, the angular velocity sensor device S2 is also characterized in that the magnetic member 700 is provided in the sensor-element-side space with respect to the adhesive agent 400, in the same manner as in the first example embodiment described above. This arrangement can properly balance the trade-off between the elastic function and the efficiency in assembly.

In the first example embodiment described above, the circuit board 300 and the sensor element 200 are successively stacked on the package 100 and the magnetic member 700 is interposed between the circuit board 300 and the adhesive agent 400.

The present example embodiment is the same as the first example embodiment described above in the structure in which the sensor element 200 is stacked on the circuit board 300. In this example embodiment, however, the circuit board 300 is solidly held on the package 100 by using a highly rigid adhesive agent not shown and the adhesive agent 400 as the elastic member is provided between the circuit board 300 and the sensor element 200. The arrangement prevents the vibration of the sensor element 200 in the angular velocity sensor device S2 according to this example embodiment.

As shown in FIG. 5, this example embodiment has interposed the magnetic member 700 between the adhesive agent 400 and the sensor element 200 in the structure in which the sensor element 200 is stacked on the circuit board 300 via the adhesive agent 400. The magnetic member 700 is solidly bonded to the sensor element 200 via the same adhesive agent as used in the example embodiment described above or the like.

For example, a method for fabricating the angular velocity sensor device S2 according to this example embodiment can be implemented as follows. First, the circuit board 300, the adhesive agent 400, the magnetic member 700, and the sensor element 200 are stacked in layers and integrated by curing the adhesive agent 400. The integrated body is mounted on the package 100 and adhesively fixed.

It is also possible to, e.g., mount the circuit board 300 first in fixed relation onto the package 100, stack the adhesive agent 400 and the sensor element 200 with the magnetic member 700 thereon, and then integrate them by curing the adhesive agent 400.

In a currently reached state, the sensor element 200 is held by the soft adhesive agent 400 as the elastic member on the circuit board 300. Accordingly, when wire bonding is performed, it is accomplished in the state in which the sensor element 200 is solidly fixed to the package 100 by using the magnetic force of each of the magnetic member fixing means and magnetic member 700 described above. The bonding wires 500 are thus formed, in the same manner as in the example embodiment described above.

In this example embodiment also, the curing of the adhesive agent 400 may be also performed after wire bonding. Before wire bonding, the circuit board 300 and the sensor element 200 are integrated in the state in which they are temporarily bonded to each other with the adhesive agent 400 having fluidity. During wire bonding, however, a sufficient bonding property can be obtained by using the magnetic force of the magnetic member 700.

Thereafter, the removal of the magnetic force, the attachment of the lid 140 to the package 100, and the like are performed in the same manner as in the example embodiment described above, whereby the angular velocity sensor device S2 according to this example embodiment is completed.

It will be easily understood that, in this example embodiment also, the magnetic member 700 and the like can be variously modified as shown in the example embodiment described above.

Example Embodiment 3

Figure 6:
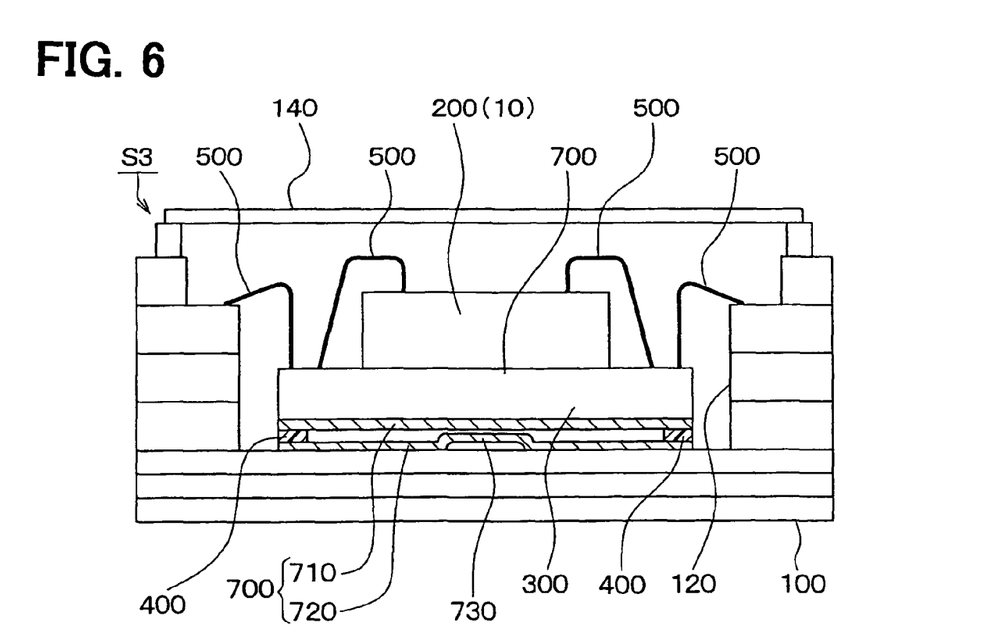
FIG. 6 is a schematic cross-sectional view of an angular velocity sensor device as a physical quantity sensor device according to a third example embodiment of the present invention.

FIG. 6 shows a schematic cross-sectional structure of an angular velocity sensor device S3 as a physical quantity sensor device according to a third example embodiment of the present invention.

The angular velocity sensor device S3 according to this example embodiment is also the angular velocity sensor device in which the sensor element 200 is mounted on the package 100 and held thereby via the adhesive agent 400 as the elastic member. In addition, the angular velocity sensor device S3 is also characterized in that the magnetic member 700 is provided in the sensor-element-side space with respect to the adhesive agent 400, similarly to the first example embodiment. The arrangement can properly balance the trade-off between the elastic function and the efficiency in assembly.

As shown in FIG. 6, the magnetic member 700 according to this example embodiment includes (i) a first magnetic member 710 located in a first space and (ii) a second magnetic member 720 located in a second space. The first and second spaces are defined with respect to the adhesive agent 400 as the elastic member, similarly in the first example embodiment. The adhesive agent 400 faces the first space (sensor-element-side space) that includes the sensor element 200, while the adhesive agent 400 faces the second space that does not include the sensor element 200 (e.g., in FIG. 6, the second space (package-side space) includes the bottom of the package 100). In other words, the first magnetic member 710 is closer to the sensor element 200 than the adhesive agent 400; the second magnetic member 720 is closer to the bottom of the package 100 than the adhesive agent 400. The first and second magnetic members 710 and 720 are opposing each other via the adhesive agent 400; namely, the adhesive agent 400 is disposed or interposed between the first and second magnetic members 710 and 720.

For instance, the circuit board 300 is mounted on the package 100 and the sensor element 200 is fixed to an upper surface thereof by using a hard adhesive agent, an adhesive film, or the like which is not shown. On the other hand, the magnetic member 700 including the first and second magnetic members 710 and 720 is interposed between the circuit board 300 and the package 100.

In FIG. 6, the upper first magnetic member 710 is solidly fixed to the circuit board 300, while the lower second magnetic member 720 is solidly fixed to the package 100, each by using a hard adhesive agent or the like which is not shown.

The adhesive agent 400 as the elastic member is interposed between the first and second magnetic members 710 and 720 to provide adhesion between the two magnetic members 710 and 720. Thus, the angular velocity sensor device S3 according to this example embodiment has a structure obtained by adding, in the foregoing structure shown in FIG. 1, another magnetic member in the second space facing the package 100 with respect to the adhesive agent 400. In this case also, elasticity is exerted by the adhesive agent 400 and vibration is restricted.

By disposing the two magnetic members 710 and 720 in opposing relation with the adhesive agent 400 interposed therebetween as in this example embodiment, a magnetic circuit can be formed between the two magnetic members 710 and 720.

The sensor element 200 and the circuit board 300 may be influenced by an electromagnetic force resulting from residual magnetism after processing. However, the structure makes it possible to suppress the leakage of a magnetic field toward the circuit board 300 and the sensor element 200 through the formation of the magnetic circuit mentioned above. Thus, this example embodiment allows the minimization of the magnetic influence of the magnetic member 700.

In addition, in the angular velocity sensor device S3 according to this example embodiment, a protruding portion 730 is provided by an embossing finish or the like at a portion of the second magnetic member 720 of the mutually opposing portions of the first and second magnetic opposing members 710 and 720, as shown in FIG. 6.

The protruding portion 730 allows the adhesive agent 400 as the elastic member to retain a thickness between the two magnetic members 710 and 720. When the two magnetic members 710 and 720 are caused to approach each other within a given distance by the magnetic force, the protruding portion 730 functions as a stopper to prevent the adhesive agent 400 from sinking under the magnetic force. This allows the adhesive agent 400 to retain a proper thickness.

Although the protruding portion 730 is provided only at the second magnetic member 720 in the example shown in FIG. 6, the protruding portion may be also provided only at the first magnetic member 710 or at each of the first and second magnetic members 710 and 720.

In other words, the protruding portion may be provided appropriately at at least one of the mutually opposing portions of the first and second magnetic members 710 and 720 so long as it functions as a stopper to prevent the adhesive agent 400 from sinking under the magnetic force and allows the adhesive agent 400 to retain a proper thickness. Alternatively, multiple protruding portions may be also provided.

Example Embodiment 4

Figure 7:
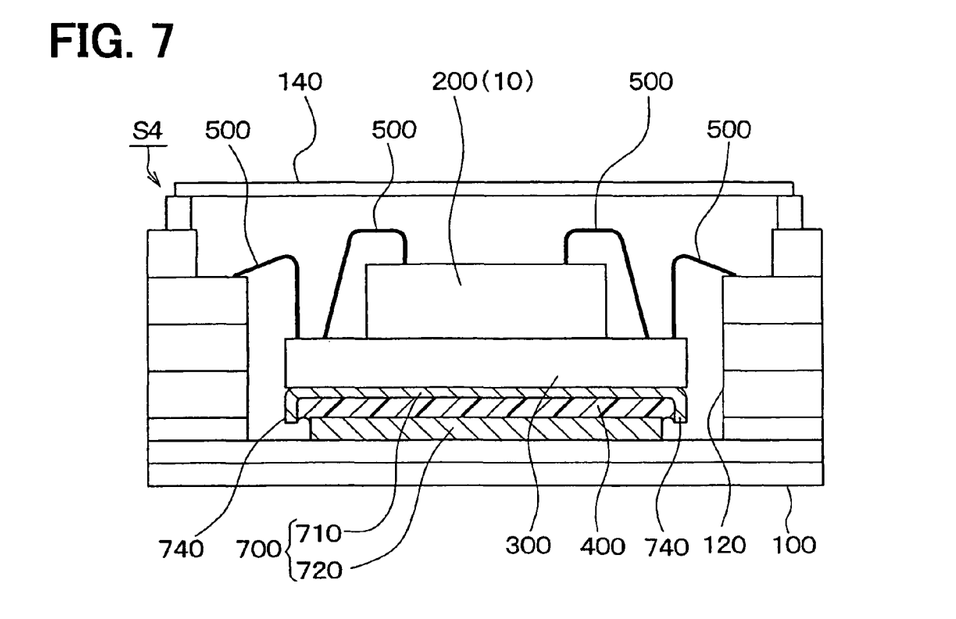
FIG. 7 is a schematic cross-sectional view of an angular velocity sensor device as a physical quantity sensor device according to a fourth example embodiment of the present invention.

FIG. 7 is a view showing a schematic cross-sectional structure of an angular velocity sensor device S4 according to a fourth example embodiment of the present invention. The present example embodiment has been obtained by partly modifying the device having the first and second magnetic members 710 and 720 according to the third example embodiment described above.

The angular velocity sensor device S4 according to this example embodiment also allows the trade-off between the elastic function and the assemblability to be properly balanced by providing the magnetic member 700 in the sensor-element-side space facing the sensor element 200 with respect to the adhesive agent 400. Furthermore, similarly to the third example embodiment, the magnetic member 700 includes two mutually opposing first and second magnetic members 710 and 720. The first magnetic member 710 is in the first space with respect to the adhesive agent 400, while the second magnetic member 720, in the second space. The first space includes the sensor element 200, while the second space includes the bottom of the package 100, as shown in FIG. 7.

Accordingly, in the angular velocity sensor device S4 according to this example embodiment also, a magnetic circuit can be formed between the two magnetic members 710 and 720 and the magnetic influence of the magnetic member 710 can be minimized.

In this example embodiment, an end portion of the first magnetic member 710 is provided with a protruding (or projecting) portion 740 that overhangs from an end portion of the second magnetic member 720 to project toward the package 100, as shown in FIG. 7.

The projecting portion 740 is configured as a bent portion formed by bending the end portion of the first magnetic member 710. To allow the adhesive agent 400 to retain a thickness between the two magnetic members 710 and 720, the projecting length of the projecting portion 740 is adjusted to be larger than a thickness of the adhesive agent 400.

In the arrangement, when the first magnetic member 710 is caused to approach the package 100 within a given distance by the magnetic force, the projecting portion 740 comes in contact with the package 100 to function as a stopper. Accordingly, this example embodiment can also prevent the adhesive agent 400 from sinking under the magnetic force and allows the adhesive agent 400 to retain a proper thickness. Furthermore, the projecting portion 740 can be alternatively provided at a portion of the first magnetic member 710 instead of the end portion of the first magnetic member 710. For instance, the projecting portion 740 can be provided in any portion of the first magnetic member 710 as long as the projecting portion 740 comes in contact with the package 100 without being intervened by the second magnetic member 720, e.g., through a through-hole provided in the second magnetic member 720.

Other Example Embodiments

Although the magnetic members 710 and 720 are interposed between the circuit board 300 and the package 100 in each of the angular velocity sensor devices which uses the magnetic member 700 composed of the first and second magnetic members 710 and 720 described above, the magnetic members 710 and 720 may be also interposed between the circuit board 300 and the sensor element 200.

In each of the angular velocity sensor devices which uses the magnetic member 700 composed of the first and second magnetic members 710 and 720, at least one of the mutually opposing portions of the first and second magnetic members 710 and 720 may have the foregoing protruding portion 730. In addition, the projecting portion 740 may be also provided at the end portion of the first magnetic member 710. In other words, it is also possible to prevent the adhesive agent 400 from sinking under the magnetic force and allow the adhesive agent 400 to retain a thickness by making effective use of each of the functions of the protruding and projecting portions described above.

When the vibrator 20 of the sensor element 200 is electromagnetically driven in each of the example embodiments described above, the magnetic member 700 can be used as a source for generating a magnetic field therefor. In this case, since the magnetic field should be positively generated, the structure can be made more compact by mounting the magnetic member 700 as a magnet.

A package is not limited to the ceramic package described above. The configuration of the package is not limited to the foregoing examples shown in the drawings.

Although the angular velocity sensor device has been described heretofore as an example of the physical quantity sensor device according to the present invention, the present invention is not limited to an angular velocity sensor and is also applicable to an acceleration sensor, a pressure sensor, a temperature sensor, a humidity sensor, an optical sensor, an image sensor, or the like.

In other words, in each of the example embodiments described above, the foregoing sensor element 200 may be also an acceleration sensing element, a pressure sensing element, a temperature sensing element, a humidity sensing element, an optical sensing element, or an image sensing element.

As the circuit board, any circuit such as a circuit using a MOS transistor, a bipolar transistor, or the like, a memory circuit, or the like may be used. In the physical quantity sensor device according to the present invention, the circuit board need not be provided and the sensor element may be attached directly to the package via the adhesive agent as the elastic member.

In this case, the magnetic member may be provided appropriately between the adhesive agent and the sensor element. The elastic member is not limited to the adhesive agent made of a resin described above. Otherwise, the elastic member may be also composed of, e.g., rubber, a low-elasticity adhesive film, or the like.

It will be obvious to those skilled in the art that various changes may be made in the above-described embodiments of the present invention. However, the scope of the present invention should be determined by the following claims.

What is claimed is:

1. A method for producing a physical quantity sensor device, the method comprising:
   arranging a magnetic member on a circuit board;
   fixing a sensor element to the circuit board on which the magnetic member is arranged;
   arranging, above a bottom of a package, an adhesive agent which functions as an elastic member;
   disposing, above the adhesive agent and above the bottom of the package, the sensor element accompanied by the circuit board and the magnetic member, such that the adhesive film is disposed between the package and the sensor element;
   arranging a magnet below the package so as to apply a magnetic force between the magnet and the magnetic member for solidly fixing the sensor element with respect to the package; and
   performing wire bonding between at least two of (i) the package, (ii) the circuit board, and (iii) the sensor element while the magnetic force between the magnet and the magnetic member is being applied.

2. A physical quantity sensor device produced by the method according to claim 1.

3. The physical quantity sensor device according to claim 2, wherein the physical quantity sensor device is used for sensing at least one of an angular velocity and an angular acceleration.

4. The method for producing a physical quantity sensor device according to claim 1 further comprising:
   removing the magnet from below the package after the operation of performing wire bonding.

5. A physical quantity sensor device produced by the method according to claim 4.

6. The physical quantity sensor device according to claim 5, wherein the physical quantity sensor device is used for sensing at least one of an angular velocity and an angular acceleration.

7. The method for producing a physical quantity sensor device according to claim 1 wherein during the operation of arranging the magnet below the package, the adhesive agent is arranged between the magnetic member and the package.

8. The method for producing a physical quantity sensor device according to claim 1 further comprising:
   curing the adhesive agent after the operation of performing wire bonding.

9. The method for producing a physical quantity sensor device according to claim 1 further comprising:
 arranging the magnet below the package so as to apply the magnetic force between the magnet and the magnetic member for repelling the sensor element away from the package, after the operation of performing wire bonding; and
 curing the adhesive agent after repelling the sensor element away from the package.

10. The method for producing a physical quantity sensor device according to claim 1, wherein the magnetic member generates a magnetic field.

11. A physical quantity sensor device produced by the method according to claim 10.

12. A method for producing a physical quantity sensor device, the method comprising:
 forming an elastic adhesive agent over a package;
 arranging a magnetic member over the elastic adhesive agent;
 arranging a magnet below the package so as to apply a magnetic force between the magnet and the magnetic member to press the magnetic member against the elastic adhesive agent;
 fixing a circuit board to the magnetic member while the magnetic force between the magnet and the magnetic member is being applied;
 fixing a sensor element to the circuit board while the magnetic force between the magnet and the magnetic member is being applied; and
 performing wire bonding between at least two of (i) the package, (ii) the circuit board, and (iii) the sensor element while the magnetic force between the magnet and the magnetic member is being applied.

13. A physical quantity sensor device produced by the method according to claim 12.

14. The method for producing a physical quantity sensor device according to claim 12 further comprising:
 curing the elastic adhesive agent after the operation of performing wire bonding to form a cured adhesive agent.

15. The method for producing a physical quantity sensor device according to claim 12 further comprising:
 arranging the magnet below the package so as to apply the magnetic force between the magnet and the magnetic member for repelling the sensor element away from the package, after the operation of performing wire bonding; and
 curing the adhesive agent after repelling the sensor element away from the package.

16. A physical quantity sensor device produced by the method according to claim 15.

17. A method for producing a physical quantity sensor device, the method comprising:
 forming an elastic adhesive agent over a package;
 arranging a magnetic member on a circuit board;
 arranging the magnetic member over the elastic adhesive agent;
 arranging a magnet below the package so as to apply a magnetic force between the magnet and the magnetic member to press the circuit board towards the elastic adhesive agent;
 fixing a sensor element to the circuit board while the magnetic force between the magnet and the magnetic member is being applied; and
 performing wire bonding between at least two of (i) the package, (ii) the circuit board, and (iii) the sensor element while the magnetic force between the magnet and the magnetic member is being applied.

18. A physical quantity sensor device produced by the method according to claim 17.

19. The method for producing a physical quantity sensor device according to claim 17 further comprising:
 arranging the magnet below the package so as to apply the magnetic force between the magnet and the magnetic member for repelling the sensor element away from the package, after the operation of performing wire bonding; and
 curing the adhesive agent after repelling the sensor element away from the package.

20. A physical quantity sensor device produced by the method according to claim 19.

* * * * *